United States Patent
Kubota et al.

(10) Patent No.: US 8,361,886 B2
(45) Date of Patent: Jan. 29, 2013

(54) METHOD FOR PROGRAMMING AN ANTI-FUSE ELEMENT, AND SEMICONDUCTOR DEVICE

(75) Inventors: Yoshitaka Kubota, Kanagawa (JP); Takuji Onuma, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 67 days.

(21) Appl. No.: 12/958,722

(22) Filed: Dec. 2, 2010

(65) Prior Publication Data

US 2011/0127591 A1 Jun. 2, 2011

(30) Foreign Application Priority Data

Dec. 2, 2009 (JP) ................................. 2009-274660

(51) Int. Cl.
*H01L 21/78* (2006.01)
*H01L 21/46* (2006.01)
*H01L 21/82* (2006.01)
*H01L 29/00* (2006.01)
*H01L 23/525* (2006.01)

(52) U.S. Cl. ........ 438/467; 438/131; 257/530; 257/529; 257/E23.147

(58) Field of Classification Search .................. 438/467, 438/131; 257/530, 529, E23.147
See application file for complete search history.

(56) References Cited

U.S. PATENT DOCUMENTS

| | | | |
|---|---|---|---|
| 5,019,878 A | 5/1991 | Yang et al. | |
| 5,241,496 A * | 8/1993 | Lowrey et al. | 365/96 |
| 7,157,782 B1 * | 1/2007 | Shih et al. | 257/530 |
| 7,329,911 B2 * | 2/2008 | Okayama | 257/209 |
| 8,101,471 B2 * | 1/2012 | Hafez et al. | 438/132 |
| 2004/0023440 A1 * | 2/2004 | Ito et al. | 438/131 |

FOREIGN PATENT DOCUMENTS

JP 2-294067 12/1990

* cited by examiner

*Primary Examiner* — Luan C Thai
(74) *Attorney, Agent, or Firm* — Young & Thompson

(57) ABSTRACT

A method for programming an anti-fuse element in which the ratio between current values before and after writing is increased to ensure accuracy in making a judgment about how writing has been performed on the anti-fuse element. The method for programming the anti-fuse element as a transistor includes the steps of applying a prescribed gate voltage to a gate electrode to break down a gate dielectric film, and moving the silicide material of a silicide layer formed on a surface of at least one of a first impurity diffusion region and a second impurity diffusion region, into the gate dielectric film in order to couple the gate electrode with at least the one of the first impurity diffusion region and the second impurity diffusion region electrically through the silicide material.

8 Claims, 5 Drawing Sheets

METHOD FOR PROGRAMMING AN ANTI-FUSE ELEMENT, AND SEMICONDUCTOR DEVICE

CROSS-REFERENCE TO RELATED APPLICATIONS

The disclosure of Japanese Patent Application No. 2009-274660 filed on Dec. 2, 2009 including the specification, drawings and abstract is incorporated herein by reference in its entirety.

BACKGROUND OF THE INVENTION

The present invention relates to a method for programming an anti-fuse element, and a semiconductor device.

An anti-fuse element in which a gate dielectric film is broken down is known as a device for data programming. In a method for programming this type of anti-fuse element, a voltage is applied to the gate electrode to break down the gate dielectric film and thereby create a conductive path between the gate electrode and source/drain for writing.

Japanese Unexamined Patent Publication No. Hei 2 (1990)-294067 describes an anti-fuse with silicide (titanium silicide) layers formed over drain and source regions in which a programming voltage is applied to the drain region, and the silicide formed over the drain region flows between the drain and source regions to form a filament and decrease the resistance of the drain and source regions for an anti-fuse connection.

SUMMARY OF THE INVENTION

However, this anti-fuse element has a problem that even though writing has been performed, it is difficult to make a judgment about how writing has been performed on the anti-fuse element accurately because change in resistivity is small.

Also, in the technique described in the above patent document, the drain and source regions are made conductive with each other unlike anti-fuse elements in which a gate dielectric film is broken down to create a conductive path between the gate electrode and the source/drain for writing. Therefore, the circuit for judging how writing has been performed must be different from the conventional one and a significant structural change is thus needed.

According to one aspect of the present invention, there is provided a method for programming an anti-fuse element as a transistor which includes a first impurity diffusion region and a second impurity diffusion region being formed on a surface of a substrate and each having a silicide layer formed on a surface thereof, and a gate including a gate dielectric film formed between the first impurity diffusion region and the second impurity diffusion region and a gate electrode. The method includes the steps of applying a prescribed gate voltage to the gate electrode to break down the gate dielectric film, and moving a silicide material of the silicide layer formed on a surface of at least one of the first impurity diffusion region and the second impurity diffusion region, into the gate dielectric film to couple the gate electrode with at least the one of the first impurity diffusion region and the second impurity diffusion region electrically through the silicide material.

According to another aspect of the invention, there is provided a semiconductor device including an anti-fuse element as a transistor which includes a first impurity diffusion region and a second impurity diffusion region being formed on a surface of a substrate and each having a silicide layer formed on a surface thereof, and a gate including a gate dielectric film formed between the first impurity diffusion region and the second impurity diffusion region and a gate electrode. In this semiconductor device, a silicide material of the silicide layer formed on a surface of at least one of the first impurity diffusion region and the second impurity diffusion region is moved into the gate dielectric film and the gate electrode is electrically coupled with at least the one of the first impurity diffusion region and the second impurity diffusion region through the silicide material.

According to these aspects of the invention, in the gate dielectric breakdown type anti-fuse element, in writing (in breaking down the gate dielectric film), not only the gate dielectric film is broken down but also the silicide material is moved from the silicide layer formed on the surface of the first or second impurity diffusion region as a source/drain so as to form a filament with lower resistance. This means that the ratio between current values before and after writing is increased. Therefore, a judgment about how writing has been performed on the anti-fuse element can be made with high accuracy.

Any combination of the abovementioned components and a conversion between a method and a device in an expression of the present invention are also effective in a mode for carrying out the invention.

According to the present invention, the ratio between current values before and after writing is increased so that a judgment can be made accurately about how writing has been performed on the anti-fuse element.

BRIEF DESCRIPTION OF THE DRAWINGS

FIGS. 1A to 1C are sectional views showing the structure of a semiconductor device including an anti-fuse element according to an embodiment of the present invention, in which FIG. 1A shows a state before writing, FIG. 1B shows a state in which writing is underway, and FIG. 1C shows a state after writing;

FIGS. 2A to 2C are plan views showing the structure of the semiconductor device including the anti-fuse element according to the embodiment of the present invention, in which FIG. 2A shows a state before writing, FIG. 2B shows a state in which writing is underway, and FIG. 2C shows a state after writing;

DETAILED DESCRIPTION OF THE PREFERRED EMBODIMENTS

Figure 1A:
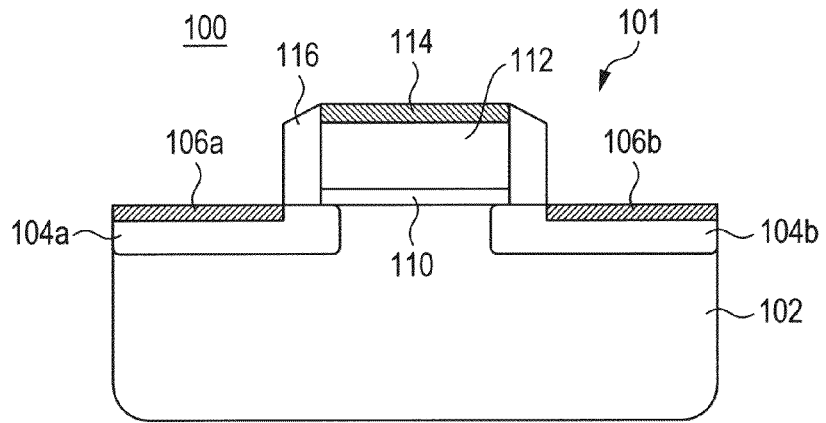

Next, the preferred embodiments of the present invention will be described referring to the accompanying drawings. In all the drawings, elements with like functions are designated by like reference numerals and repeated descriptions of such elements are omitted.

Figure 1B:
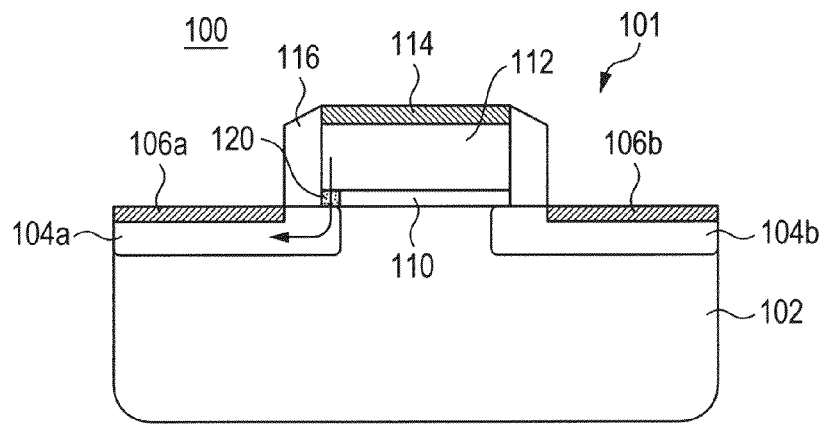
Figure 1C:
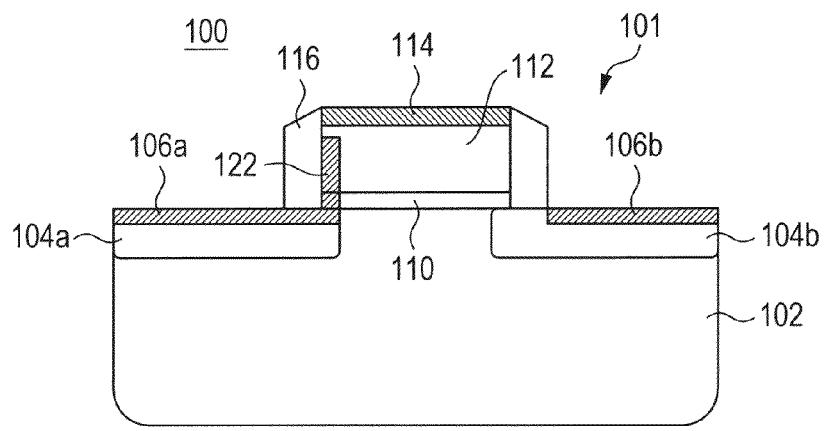
Figure 2A:
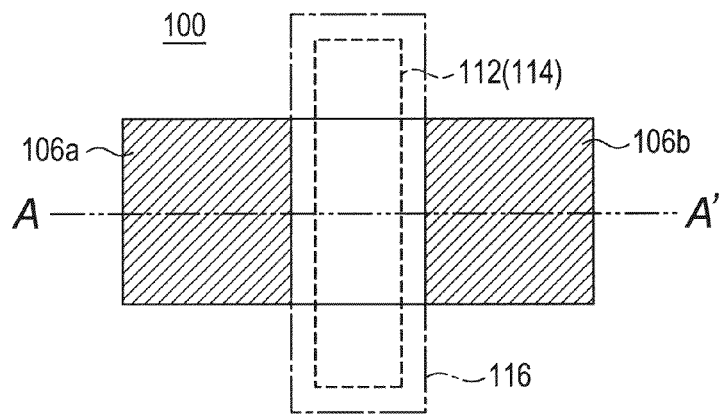
Figure 2B:
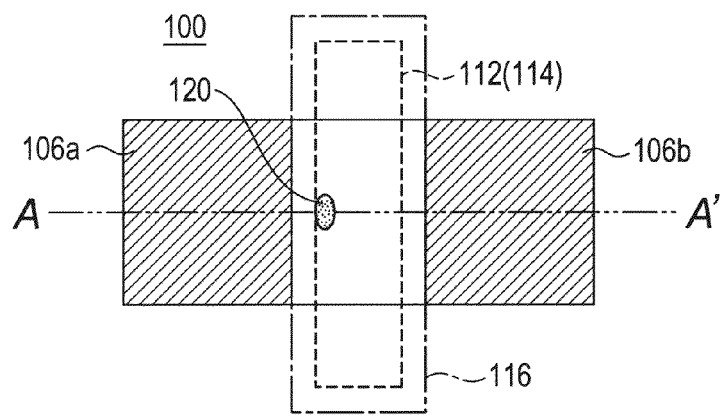
Figure 2C:
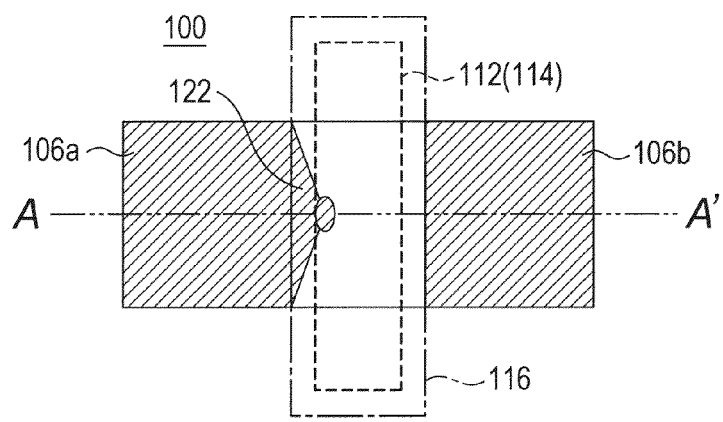

FIGS. 1A to 1C are sectional views showing the structure of a semiconductor device including an anti-fuse element according to an embodiment of the invention. FIGS. 2A to 2C are plan views showing the structure of the semiconductor device including the anti-fuse element according to the embodiment. FIGS. 1A to 1C are sectional views taken along the line A-A' of FIGS. 2A to 2C respectively. FIG. 1A and FIG. 2A show a state before writing. FIG. 1B and FIG. 2B show a state in which writing is underway. FIG. 1C and FIG. 2C show a state after writing.

A semiconductor device 100 includes an anti-fuse element 101 as a transistor which includes a substrate 102, an impurity diffusion region 104a (first impurity diffusion region) and an impurity diffusion region 104b (second impurity diffusion region) having a silicide layer 106a and a silicide layer 106b formed on surfaces thereof, respectively, and a gate formed between the impurity diffusion region 104a and impurity diffusion region 104b and having a gate dielectric film 110, a gate electrode 112, and a side wall 116. In this embodiment, the anti-fuse element 101 may be of the gate dielectric breakdown type. Also, in this embodiment, the semiconductor device 100 may be so designed that the current flowing in the gate electrode 112 is measured to make a judgment about how writing has been performed on the anti-fuse element 101. Specifically, the semiconductor device 100 may include a judgment circuit which decides that the anti-fuse element 101 has been electrically coupled and writing has been completed, if the result of measurement of the current flowing in the gate electrode 112 exceeds a prescribed level.

For example, the substrate 102 may be a semiconductor substrate such as a silicon substrate. The impurity diffusion region 104a and impurity diffusion region 104b each function as a source region or drain region. The silicide layer 106a and silicide layer 106b may be made of Ni silicide, Co silicide, or Ti silicide. In this embodiment, the silicide layer 106a and silicide layer 106b may be made of Ni silicide. This will make it easier to move the silicide layer 106a and silicide layer 106b by electromigration.

The type of gate dielectric film 110 is not limited here and an insulating material commonly used for a gate dielectric film may be used for it. For example, the gate dielectric film 110 may be a silicon oxide film, a high-permittivity dielectric film, or a laminate of several dielectric layers. In this embodiment, the gate dielectric film 110 is, for example, a silicon oxide film.

The type of side wall 116 is also not limited here and an insulating material commonly used for a side wall may be used for it. In this embodiment, the side wall 116 is, for example, a silicon oxide film, or silicon nitride film.

The type of gate electrode 112 is also not limited here and a conductive material commonly used for a gate electrode may be used for it. The gate electrode 112 may be made of polysilicon or a metal gate. In this embodiment, the gate electrode 112 is made of, for example, polysilicon. If the gate electrode 112 is made of polysilicon, it may have a silicide layer 114 over a surface thereof. The silicide layer 114 may be made of the same material as the silicide layer 106a and the silicide layer 106b. In FIGS. 2A to 2C, the gate electrode 112 and side wall 116 are indicated by broken lines for illustration.

Next, a method for programming the anti-fuse element 101 as shown in FIG. 1A (writing sequence) will be explained.

In this embodiment, the sequence of writing to the anti-fuse element 101 includes the steps of applying a prescribed gate voltage to the gate electrode 112 to break down the gate dielectric film 110, and moving the silicide material of the silicide layer (silicide layer 106a or 106b) formed on the surface of at least one of the impurity diffusion region 104a and impurity diffusion region 104b into the gate dielectric film 110 in order to electrically couple the gate electrode 112 with at least one of the impurity diffusion region 104a and impurity diffusion region 104b through the silicide material.

More specifically, this embodiment is designed so that even after the gate dielectric film 110 breaks down, a current flows between the gate electrode 112 and the impurity diffusion region 104a or impurity diffusion region 104b and the silicide material of the silicide layer 106a or silicide layer 106b formed on the surface of the impurity diffusion region 104a or impurity diffusion region 104b moves into the gate dielectric film 110.

Figure 3:
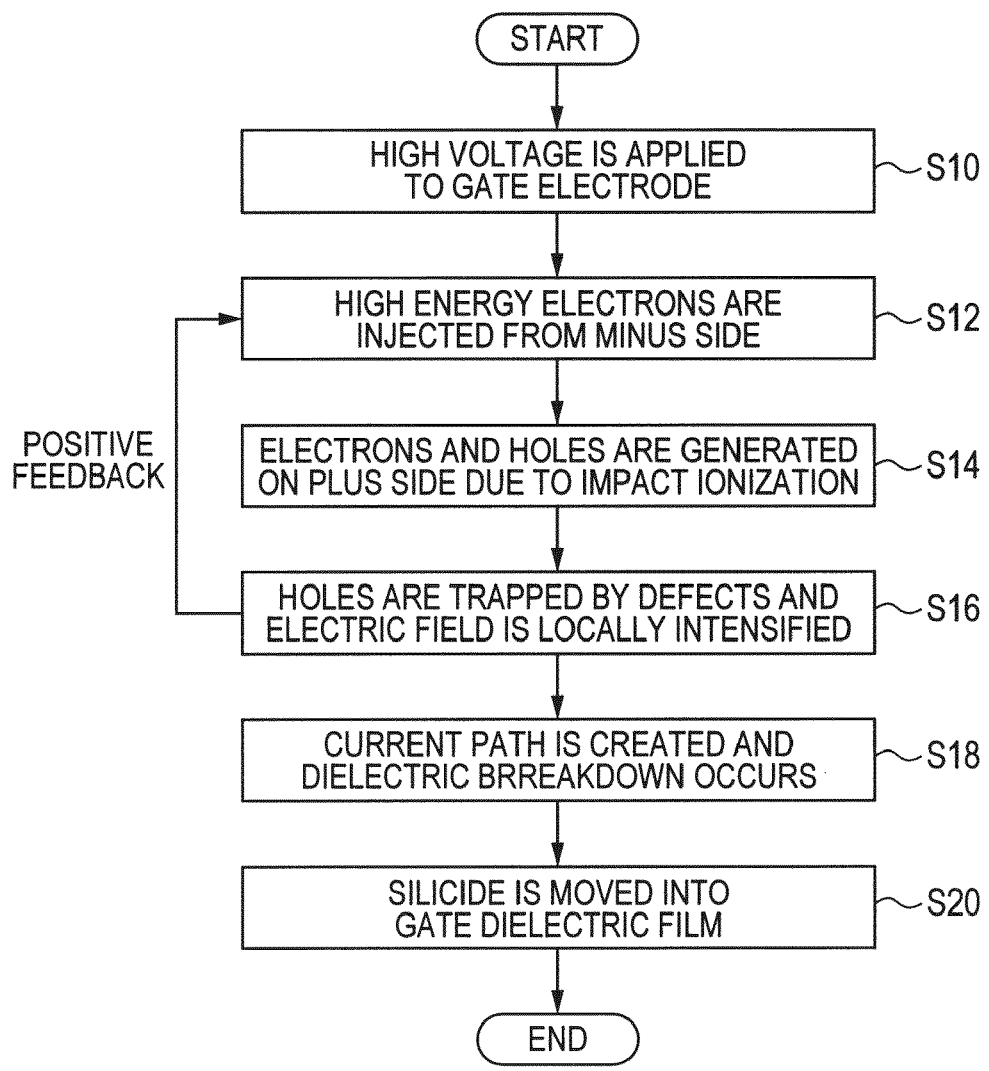
FIG. 3 is a flowchart showing a sequence of writing to the anti-fuse element according to the embodiment.
Figure 4:
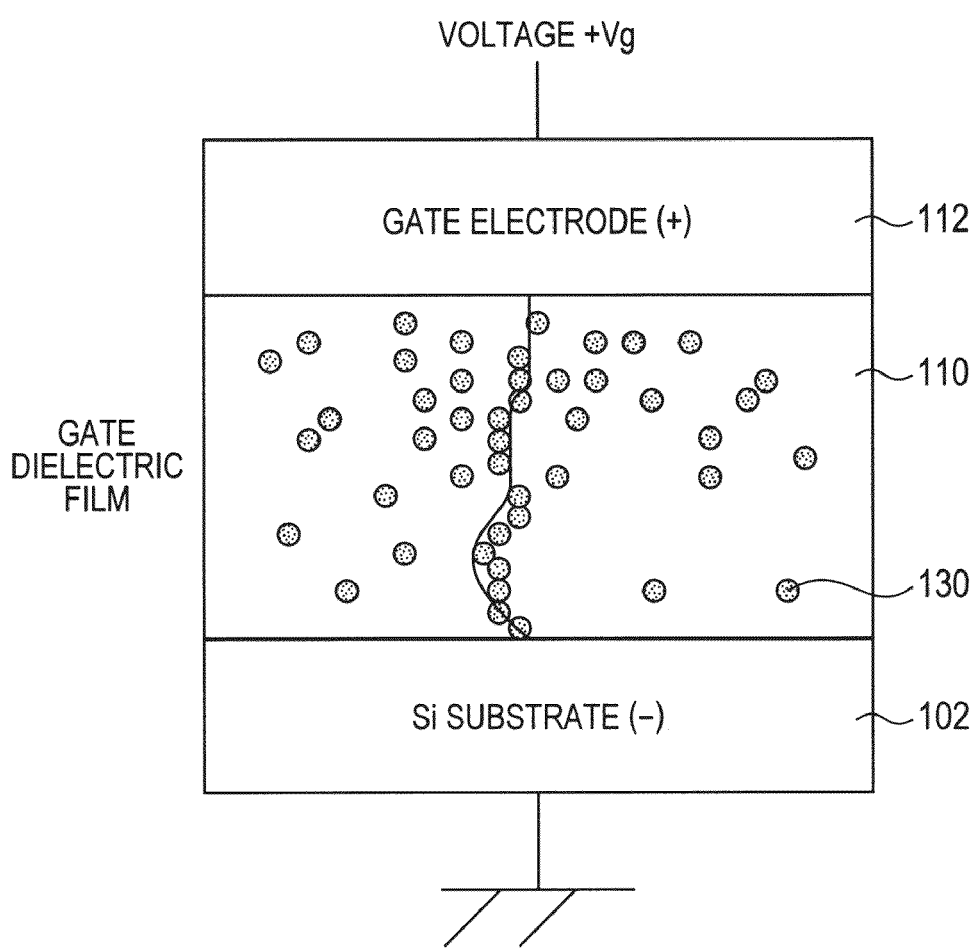
FIG. 4 is a schematic sectional view showing how writing is performed on the anti-fuse element.

FIG. 3 is a flowchart showing a method for programming the anti-fuse element 101 according to this embodiment (writing sequence). FIG. 4 is a schematic sectional view showing how writing is performed on the anti-fuse element 101. The programming method is described below referring to FIGS. 1A to 1C and FIGS. 2A to 2C as well as these figures.

First, with the substrate 102 grounded, a high voltage (+Vg) is applied to the gate electrode 112 (Step S10). This makes the gate electrode 112 positively charged (+) and the substrate 102 negatively charged (−) (see FIG. 4). As shown in FIG. 4, the gate dielectric film 110 contains defects 130 generated during deposition. As a voltage is applied between the substrate 102 and the gate electrode 112 in this condition, high energy electrons are injected from the minus side or substrate 102 (−) into the gate dielectric film 110 (Step S12). Then, electrons and holes are generated on the plus side or gate electrode 112 (+) due to impact ionization (Step S14). Then, holes are trapped by defects 130 in the gate dielectric film 110 and the electric field is locally intensified (step S16).

This creates a current path in the gate dielectric film 110 between the substrate 102 and the gate electrode 112, resulting in dielectric breakdown (Step S18). FIG. 18 and FIG. 2B show that a current path 120 is created at Step S18 in FIG. 3.

In this embodiment, with the substrate 102 grounded, the application of a high voltage to the gate electrode 112 is continued, causing the silicide material to move into the gate dielectric film 110 (Step S20). As the application of a high voltage to the gate electrode 112 is further continued with the substrate 102 grounded, the silicide material passes through the gate dielectric film 110 and moves into the gate electrode 112. The sequence of writing to the anti-fuse element 101 is thus completed.

According to this embodiment, in the anti-fuse element 101 where writing has been completed, the silicide material 122 of the silicide layer, formed on the surface of at least one of the impurity diffusion region 104a and impurity diffusion region 104b, extends into the gate dielectric film 110 as shown in FIG. 1C. In the example shown here, the silicide material 122 of the silicide layer 106a formed on the surface f the impurity diffusion region 104a extends into the gate dielectric film 110. In addition, the silicide material 122 extends through the gate dielectric film 110 into the gate electrode 112. As a consequence, the gate electrode 112 and the impurity diffusion region 104a are electrically coupled through the silicide material 122. Therefore, when a voltage is applied to the gate electrode 112, the value of current which flows in the gate electrode 112 is much larger than before writing, for example, one-digit larger.

As shown in FIG. 2B and FIG. 2C, as the current path 120 is created at Step S18 in FIG. 3, the silicide material 122 of the silicide layer 106a or silicide layer 106b moves toward the current path 120. As a consequence, the silicide material 122 exists in an area stretching from the impurity diffusion region 104a (or impurity diffusion region 104b) to the gate dielectric film 110. The silicide material 122 may extend across the area stretching from the impurity diffusion region 104a (or impurity diffusion region 104b) to the gate dielectric film 110. Even when it does not extend across the area or it just lies in some part of the area, the resistance between the gate electrode 112 and the impurity diffusion region 104a (or impurity diffusion region 104b) will be sufficiently low.

Figure 5:
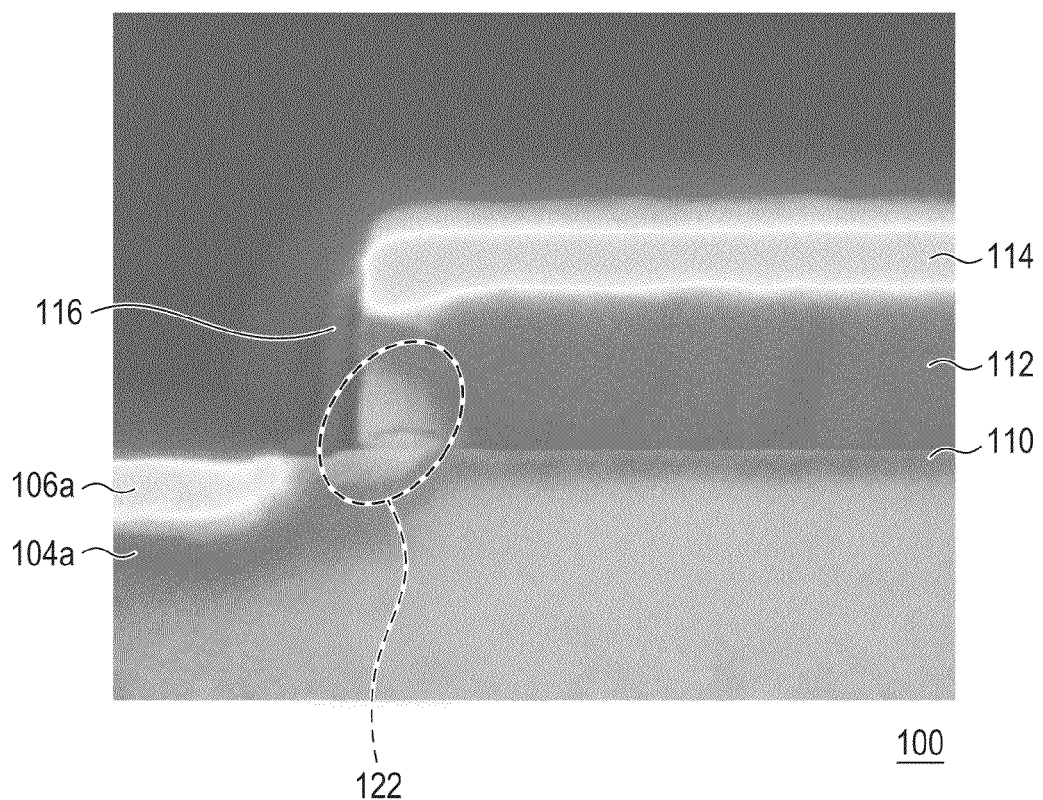
FIG. 5 is a sectional view showing the structure of the semiconductor device including the anti-fuse element where writing has been performed according to the embodiment.

FIG. 5 is a sectional view showing the structure of the semiconductor device 100 including the anti-fuse element where writing has been performed according to this embodiment. The figure shows a Z contrast image (ZC image) of a TEM (Transmission Electron Microscope) photo.

In this case, the anti-fuse element 101 was an N-type MOS transistor; the gate dielectric film 110 was a silicon oxide film; the gate electrode 112 was made of polysilicon; and the silicide layer 106a, silicide layer 106b (not shown here), and silicide layer 114 were made of Ni silicide. In this anti-fuse element 101, a high voltage (6.5 V) was applied to the gate electrode 112 for 10 microseconds with the substrate 102 grounded.

In the figure, white areas indicate a metal (silicide material). In the figure, the area enclosed by dotted line is whitish, suggesting that the silicide material 122 has been moved from the silicide layer 106a on the surface of the impurity diffusion region 104a through the gate dielectric film 110 into the gate electrode 112.

In a conventional gate dielectric breakdown type anti-fuse element, a current path created by breaking down the gate dielectric film is considered to be, for example, a defect or semiconductor material such as silicon which has moved from the substrate. Therefore, it has a problem that change in resistivity is small.

According to this embodiment, in the gate dielectric breakdown type anti-fuse element 101, in writing (in breaking down the gate dielectric film), not only the gate dielectric film 110 is broken down but also the silicide material 122 is moved into the gate dielectric film from the silicide layer 106a or silicide layer 106b formed on the surface of the impurity diffusion region 104a or impurity diffusion region 104b as a source/drain to form a filament with lower resistance. This means that the ratio between current values before and after writing is increased. Therefore, a judgment can be made accurately about how writing has been performed on the anti-fuse element. Furthermore, since the silicide material becomes solid and stable in terms of energy, thermal stability is assured.

In addition, when this technique is combined with the conventional method for breaking down a gate oxide film, it is also possible to perform writing at different current levels.

So far an embodiment of the present invention has been described in reference to the accompanying drawings. However, it is just illustrative and not restrictive and the invention may be embodied in other various ways.

What is claimed is:

1. A method for programming an anti-fuse element as a transistor, the transistor including:
   a first impurity diffusion region and a second impurity diffusion region being formed on a surface of a substrate and each having a silicide layer formed on a surface thereof; and
   a gate formed between the first impurity diffusion region and the second impurity diffusion region and including a gate dielectric film and a gate electrode,
   the method comprising:
   applying a prescribed gate voltage to the gate electrode to break down the gate dielectric film; and
   moving a silicide material of the silicide layer formed on a surface of at least one of the first impurity diffusion region and the second impurity diffusion region, into the gate dielectric film to couple the gate electrode with at least the one of the first impurity diffusion region and the second impurity diffusion region electrically through the silicide material.

2. The method for programming an anti-fuse element according to claim 1, wherein at the step of electrical coupling, the silicide material is passed through the gate dielectric film and moved into the gate electrode.

3. The method for programming an anti-fuse element according to claim 1, wherein a current flowing in the gate electrode is measured to make a judgment about how writing has been performed on the anti-fuse element.

4. A semiconductor device including an anti-fuse element as a transistor, the transistor including:
   a first impurity diffusion region and a second impurity diffusion region being formed on a surface of a substrate and each having a silicide layer formed on a surface thereof; and
   a gate formed between the first impurity diffusion region and the second impurity diffusion region and having a gate dielectric film and a gate electrode,
   wherein a silicide material of the silicide layer formed on a surface of at least one of the first impurity diffusion region and the second impurity diffusion region is configured for movement under influence of a current created by applying a prescribed gate voltage to the gate electrode, into the gate dielectric film and the gate electrode to be electrically coupled with at least the one of the first impurity diffusion region and the second impurity diffusion region through the silicide material.

5. The semiconductor device according to claim 4, wherein the silicide material is passed through the gate dielectric film and the silicide material is also moved into the gate electrode.

6. The semiconductor device according to claim 4, wherein the silicide material exists in an area stretching from at least one of the first impurity diffusion region and the second impurity diffusion region to the gate dielectric film.

7. The semiconductor device according to claim 4, further comprising a judgment circuit which makes a judgment about how writing has been performed on the anti-fuse element, by measuring a current flowing in the gate electrode.

8. A method for programming an anti-fuse element as a transistor, the transistor including
   a first impurity diffusion region and a second impurity diffusion region being formed on a surface of a substrate,
   a first silicide layer formed on a surface of the first impurity diffusion region,
   a second silicide layer formed on a surface of the second impurity diffusion region, and
   a gate formed between the first impurity diffusion region and the second impurity diffusion region, the gate including a gate dielectric film and a gate electrode,
   the method comprising applying a prescribed gate voltage to the gate electrode to break down the gate dielectric film, the applied gate voltage breaking down the gate dielectric film sufficient to create a current path causing movement of a silicide material of one of the first and second silicide layers towards the current path and into a portion of the gate dielectric film to electrically couple the gate electrode with at least the one of the first impurity diffusion region and the second impurity diffusion region through the moved silicide material, the moved silicide material extending up a vertical sidewall portion of the gate electrode.

* * * * *